(12) United States Patent
Liou

(10) Patent No.: US 6,982,220 B1
(45) Date of Patent: Jan. 3, 2006

(54) SEMICONDUCTOR DEVICE POWER DISTRIBUTION SYSTEM AND METHOD

(75) Inventor: Shiann-Ming Liou, Campbell, CA (US)

(73) Assignee: Marvell International LTD., Hamilton (BM)

( * ) Notice: Subject to any disclaimer, the term of this patent is extended or adjusted under 35 U.S.C. 154(b) by 0 days.

(21) Appl. No.: 10/780,605

(22) Filed: Feb. 19, 2004

Related U.S. Application Data

(62) Division of application No. 10/051,965, filed on Jan. 16, 2002, now Pat. No. 6,770,982.

(51) Int. Cl.
*H01L 21/44* (2006.01)

(52) U.S. Cl. ........................ 438/617; 438/123
(58) Field of Classification Search ................. 438/617, 438/123
See application file for complete search history.

(56) References Cited

U.S. PATENT DOCUMENTS

| | | |
|---|---|---|
| 4,359,754 A | 11/1982 | Hayakawa et al. |
| 4,403,240 A | 9/1983 | Seki et al. |
| 5,384,487 A | 1/1995 | Rostoker et al. |
| 5,838,072 A | 11/1998 | Li et al. |
| 5,869,870 A | 2/1999 | Lin |
| 5,905,639 A | 5/1999 | Warren |
| 5,960,262 A | 9/1999 | Torres et al. |
| 5,986,345 A | 11/1999 | Monnot |
| 5,989,939 A | 11/1999 | Fjelstad |
| 6,025,616 A | 2/2000 | Nguyen et al. |
| 6,043,539 A | 3/2000 | Sigasawara |
| 6,091,140 A | 7/2000 | Toh et al. |
| 6,097,098 A | 8/2000 | Ball |
| 6,107,681 A | 8/2000 | Lin |
| 6,144,093 A | 11/2000 | Davis et al. |
| 6,169,331 B1 | 1/2001 | Manning et al. |
| 6,211,565 B1 | 4/2001 | Yu |
| 6,246,113 B1 | 6/2001 | Lin |
| 6,424,223 B1 * | 7/2002 | Wang et al. ................. 330/286 |

* cited by examiner

*Primary Examiner*—Luan Thai

(57) ABSTRACT

An integrated circuit power distribution system and method is provided. The integrated circuit comprises a semiconductor die that includes at least one pair of bond pads having a single bond wire connected thereto such that each bond pad of the pair of bond pads has only one bond wire end connected thereto. A first bond pad of the pair of bond pads is located in an internal portion of the semiconductor die. A first wire having a first end and a second end is electrically connected between the pair of bond pads.

18 Claims, 2 Drawing Sheets

SEMICONDUCTOR DEVICE POWER DISTRIBUTION SYSTEM AND METHOD

The present application is a divisional of application Ser. No. 10/051,965 filed Jan. 16, 2002, now U.S. Pat. No. 6,770,982, the contents of which is incorporated herein by reference.

TECHNICAL FIELD

This invention relates to power and signal distribution in semiconductor dies.

BACKGROUND

Many conventional semiconductors are mounted in packages such as Quad Flat Packs (QFPs) and Pin Ball Gate Arrays (PBGAs) in which the input and output terminals are arranged along the edge of the die. Arranging the terminals along the die edge may result in relatively long wirings on silicon to supply power and ground to the center of the die. These long wirings generally have a relatively high resistance leading to-unacceptable IR voltage drops.

SUMMARY OF THE INVENTION

An integrated circuit power distribution system and method is provided. The integrated circuit comprises a semiconductor die that includes at least one pair of bond pads having a single bond wire connected thereto such that each bond pad of the pair of bond pads has only one bond wire end connected thereto. A first bond pad of the pair of bond pads is located in an internal portion of the semiconductor die. A first wire having a first end and a second end is electrically connected between, the pair of bond pads.

DESCRIPTION OF DRAWINGS

Like reference symbols in the various drawings indicate like elements.

DETAILED DESCRIPTION

Figure 1:
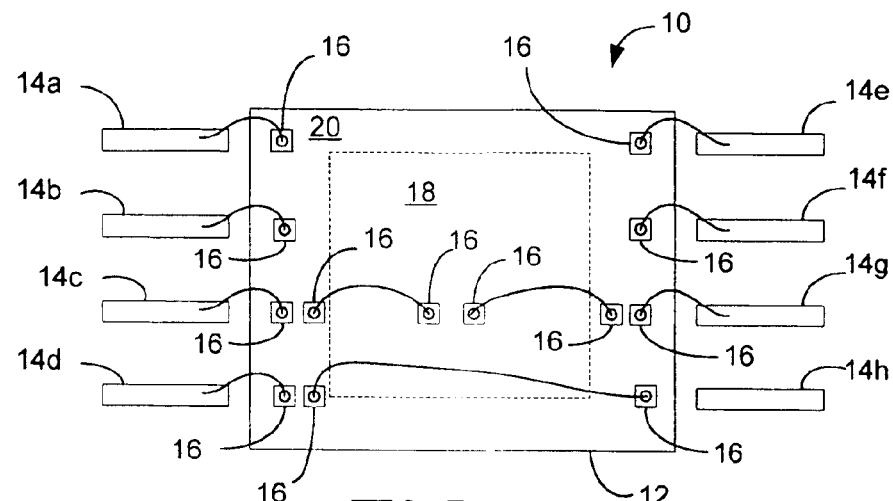
FIG. 1 is a two-dimensional top-view of a semiconductor device.

FIG. 1 shows a top-view of a semiconductor power distribution system and method. A semiconductor device 10 includes a semiconductor die 12 and several lead fingers 14a–14h. The semiconductor device 10 may be mounted in any suitable package such as QFPs and PBGAs.

The semiconductor die 12 includes bonding surfaces 16 arranged in an interior portion 18 of the semiconductor die 12 as well as along an outer periphery 20 of the semiconductor die 12. The bonding surfaces 16 are preferably bonding pads connected to traces in the semiconductor die 12. The bonding surfaces 16 provide connection points for lead wires 22 extending to other bonding surfaces 16 or lead fingers 14. Employing a lead wire 22 within the interior portion 18 may advantageously reduce the voltage drop caused by IR losses in a trace. In addition, a lead wire 22 may be used in place of a trace to reduce the density of traces within the semiconductor die 12. Using a lead wire 22 to couple electrical signals to internal portions of the semiconductor 12 may be particularly advantageous in high density semiconductors where using wide low resistance traces-to carry the signal would require additional layers. In one example, a lead wire 22 may be connected in parallel with a trace in the semiconductor die 18 to reduce the combined resistance, thereby decreasing the voltage drop associated with the trace. In a second example, a lead wire 22 may be used in lieu of using a trace within the semiconductor die 18. In a third-example, a lead wire may be connected from a bonding surface 16 located along one edge of the semiconductor periphery 20 to another bonding surface 16 located along another edge of the semiconductor periphery 20.

The lead wires 22 are bonded to different ones of the bonding surfaces 16 and/or lead finger 14 to provide low resistance connections for electrical signals such as power, ground, and signals. The lead wires 14 may comprise an electrically conductive material such as gold, aluminum, and copper that has a low electrical resistance. Each of the lead fingers 14 may be coupled to a bonding surface or remain as a non-connected lead finger 14h. Any wire bonding method such as thermocompression and ultrasonic may be used to bond the lead wires 14 to the bonding surfaces 16 and lead fingers 14.

The lead wires 22 may be bonded using any wire bond type such as ball bond, stitch bond on bonding pad, and stitch bond on ball. A ball-bond may be formed by first forming a sphere at the end of a lead wire. Then, the sphere is pressed against a bonding surface for a few seconds to form a weld. A stitch bond on bonding pad may be formed by placing the tail of a lead parallel to a bonding surface. Then, pressure is applied to the lead wire forcing the lead wire onto the bonding pad. A stitch bond on ball may be formed in similar manner to forming a stitch bond on bonding pad, except a ball is first formed on the bonding surface.

Figure 2:
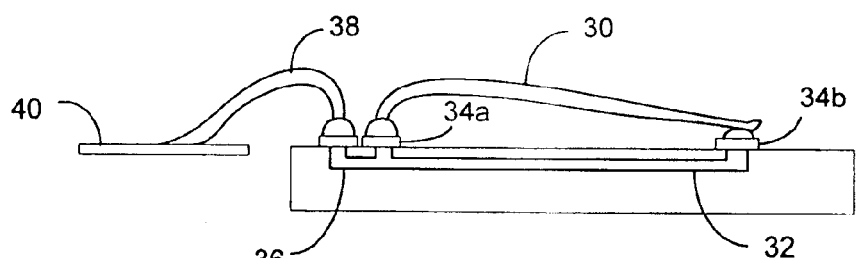
FIG. 2 is a two-dimensional side-view of a semiconductor device.

FIG. 2 shows another aspect of the semiconductor power distribution system. A lead wire 30 is connected in parallel with a trace 32 to reduce the electrical resistance of a connection between two bonding surfaces 34a and 34b. The lead wire 30 may be connected via a trace 36 to another lead wire 38 that is connected to a lead finger 40. The lead wire 30 reduces the voltage losses associated with the electrical resistance of the trace 32 by providing a parallel path for current.

Figure 3:
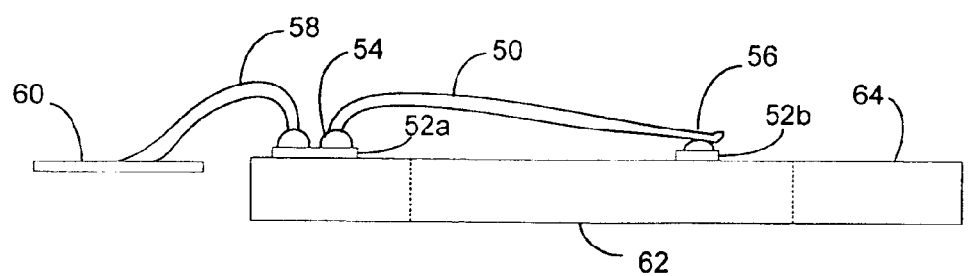
FIG. 3 is a two-dimensional side-view of a semiconductor device.

FIG. 3 shows another aspect of the semiconductor power distribution system and method. A lead wire 50 is connected between two bonding surfaces 52a and 52b. The bonding surface 52b is preferably located within an interior portion 62 of a semiconductor die 64. The lead wire 50 is used in lieu of a trace to carry electrical signals between the bonding surfaces 52a and 52b. The lead wire 50 may be coupled to the bonding surfaces 52a and 52b via a ball bond 54 and a stitch bond on ball 56 respectively. Another lead wire 58 may connect the bonding surface 52a to a lead finger 60 so that signals may be coupled between the lead finger 60 and the interior portion 62 of the semiconductor die 64 without traversing within the semiconductor die 64.

Figure 4:
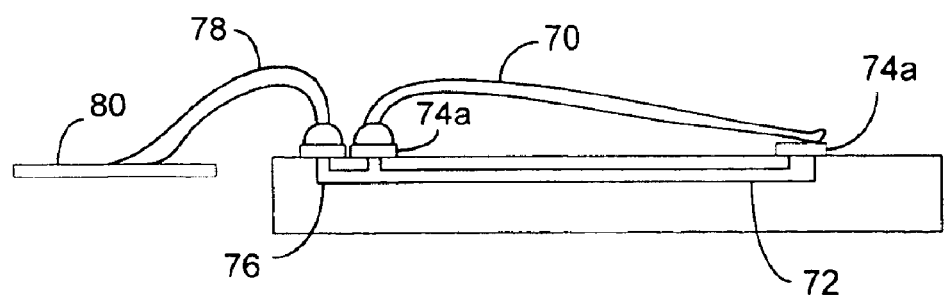
FIG. 4 is a two-dimensional side-view of a semiconductor device.

FIG. 4 shows another aspect of the semiconductor power distribution system and method similar to that shown in FIG. 2 in function with corresponding elements numbered in the range 70 to 80, except that the lead wire 70 is connected at bonding surface 74b with a stitch on pad type of bond.

A number of embodiments of the invention have been described. Nevertheless, it will be understood that various modifications may be made without departing from the spirit and scope of the invention. Accordingly, other embodiments are within the scope of the following claims.

What is claimed is:

1. A method of distributing power in a semiconductor device, comprising;

providing at least one pair of bond pads to the semiconductor device;

providing an input/output bond pad to an outer periphery of the semiconductor device, the input/output bond pad to receive and input/output bond wire operable for electrically connecting to a lead finger of a package, wherein the leader finger is arranged on the package outside of the outer periphery of the semiconductor die;

connecting a single corresponding bond wire between each of the at least one pair of bond pads such that each bond pad of each of the at least one pair of bond pads has only one bond wire end connected thereto;

locating a first bond pad of the at least one pair of bond pads in an internal portion of the semiconductor die; and electrically connecting the input/output bond pad to a second bond pad of the at least one pair of bond pads.

2. The method of claim 1 further comprising locating the second bond pad the at least one pair of bond pads along a periphery of the semiconductor die.

3. The method of claim 1 wherein the single corresponding bond wire comprises a metallic material selected from the group consisting of gold, aluminum, and copper.

4. The method of claim 1 further comprising bonding the single corresponding bond wire to the pair of bond pads using a wire bond type selected from the group consisting of ball bonds, stitch bonds, stitch bonds on bonding pad, and stitch bonds on ball.

5. The method of claim 1 further comprising connecting a first trace in the semiconductor die between bond pads of the pair of bond pads.

6. The method of claim 1 further comprising locating a second bond pad of the at least one pair of bond pads in the internal portion of the semiconductor die.

7. The method of claim 1 wherein the single corresponding bond wire is selected from the group consisting of power interconnect, ground interconnects, and signal interconnects.

8. The method of claim 1 further comprising: attaching a plurality of pairs of bond pads to the semiconductor die; and connecting a corresponding wire between each of the pairs of bond pads such that each bond pad of the pairs of bond pads includes a single wire bond.

9. The method of claim 1 further comprising locating the input/output bond pad on a first bond surface and a second bond pad of the at least one pair of bond pads on the first bond surface.

10. A method of distributing power in a semiconductor die, comprising:

providing an input/output bond pad to an outer periphery of the semiconductor die;

electrically connecting an input/output bond wire from a leader finger that is arranged on a package and that is located outside of the outer periphery of the semiconductor die to the input/output bond pad;

providing first and second of bond pads to the semiconductor die;

connecting a first bond wire between the first and second bond pads; and connecting the input/output bond pad to the first bond pad using at least one of a trace and a common bonding surface, wherein the first and second bond pads and the input/output bond pad have only one bond wire end connected thereto.

11. The method of claim 10 further comprising locating the first bond pad in the outer periphery of the semiconductor die.

12. The method of claim 11 further comprising locating the second bond pad in the outer periphery of the semiconductor die.

13. The method of claim 11 further comprising locating the second bond pad in an inner portion of the semiconductor die.

14. The method of claim 10 wherein the first bond pad wire comprises a metallic material selected from the group consisting of gold, aluminum, and copper.

15. The method of claim 10 further comprising bonding the first bond wire to the first and second bond pads using a wire bond type selected from the group consisting of all bonds, stitch bonds, stitch bonds on bonding pad, and stitch bonds on ball.

16. The method of claim 10 wherein the first bond wire is selected from the group consisting of power interconnects, ground interconnects, and signal interconnects.

17. The method of claim 10 further comprising:

attaching a plurality of pairs of bond pads to the semiconductor die; and connecting a corresponding wire between each of the pairs of bond pads such that each bond pad of the pairs of bond pads includes a single wire bond.

18. The method of claim 10 further comprising locating the input/output bond pad on a first bond surface and a second bond pad of the at least one pair of bond pads on the first bond surface.

* * * * *

UNITED STATES PATENT AND TRADEMARK OFFICE
CERTIFICATE OF CORRECTION

PATENT NO. : 6,982,220 B1
APPLICATION NO. : 10/780605
DATED : January 3, 2006
INVENTOR(S) : Shiann-Ming Liou It is certified that error appears in the above-identified patent and that said Letters Patent is hereby corrected as shown below:

ON THE TITLE PAGE, ITEM (56)

Add the following references

--5,495,398 02/1996 Takiar et al.--
--6,348,400 02/2002 Schoenfeld--

--6,169,331 B1 1-2001 Manning et al.--

TITLE PAGE, ITEM (57), REPLACE ABSTRACT WITH THE FOLLOWING:

A method of distributing power in a semiconductor die comprises providing at least one pair of bond pads to the semiconductor die. An input/output bond pad is provided to an outer periphery of the semiconductor die. The input/output bond pad receives an input/output bond wire operable for electrically connecting to a lead finger of a package. The lead finger is arranged on the package outside of the outer periphery of the semiconductor die. A single corresponding bond wire is connected between each of the pair of bond pads: such that each bond pad of each of the pair of bond pads has only one bond wire end connected thereto. A first bond pad of the pair of bond pads is located in an internal portion of the semiconductor die. The input/output bond pad is electrically connected to a second bond pad of the pair of bond pads.

IN THE PATENT:

| | |
|---|---|
| Column 1, Line 22: | Delete "-"after "to" |
| Column 1, Line 34: | Delete " , " after "between" |
| Column 2, Line 2: | Delete "-" after "traces" |
| Column 3, Line 3: | Delete "device" and insert -- die -- |
| Column 3, Line 5: | Delete "device" and insert -- die -- |
| Column 3, Line 7: | Delete "device" and insert -- die-- |
| Column 3, Line 8: | Delete "and" and insert -- an -- |
| Column 3, Line 10: | Delete "leader" and insert -- lead -- |
| Column 3, Line 23: | Insert -- of -- after "pad" |
| Column 3, Line 34: | Delete "first" after "a" |
| Column 3, Line 41: | Delete "interconnect" and insert -- interconnects -- |

UNITED STATES PATENT AND TRADEMARK OFFICE
CERTIFICATE OF CORRECTION

PATENT NO. : 6,982,220 B1
APPLICATION NO. : 10/780605
DATED : January 3, 2006
INVENTOR(S) : Shiann-Ming Liou It is certified that error appears in the above-identified patent and that said Letters Patent is hereby corrected as shown below:

Column 4, Claim 10, Line 6:   Delete "leader" and insert -- lead --
Column 4, Claim 14, Line 30:  Delete "pad' after "bond"
Column 4, Claim 15, Line 35:  Delete "all" and insert -- ball --

Signed and Sealed this

Fifth Day of December, 2006

JON W. DUDAS
*Director of the United States Patent and Trademark Office*